US006643178B2

(12) United States Patent
Kurihara

(10) Patent No.: US 6,643,178 B2
(45) Date of Patent: Nov. 4, 2003

(54) SYSTEM FOR SOURCE SIDE SENSING

(75) Inventor: Kazuhiro Kurihara, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/920,249

(22) Filed: Jul. 31, 2001

(65) Prior Publication Data

US 2003/0039147 A1 Feb. 27, 2003

(51) Int. Cl.[7] .............................................. G11C 16/06
(52) U.S. Cl. ................... 365/185.21; 365/185.2
(58) Field of Search ....................... 365/185.2, 185.21, 365/205, 207, 208, 210

(56) References Cited

U.S. PATENT DOCUMENTS

| 5,555,217 | A | * | 9/1996 | Hashimoto | ............. 365/230.03 |
| 5,757,697 | A | * | 5/1998 | Briner | ...................... 365/185.2 |
| 5,986,937 | A | * | 11/1999 | Yero | ........................ 365/185.2 |
| 6,191,979 | B1 | * | 2/2001 | Uekubo | ................... 365/185.2 |
| 6,292,395 | B1 | * | 9/2001 | Lin | .......................... 365/185.2 |
| 6,510,082 | B1 | * | 1/2003 | Le et al. | ................. 365/185.21 |

* cited by examiner

Primary Examiner—Son Mai
(74) Attorney, Agent, or Firm—Sheppard Mullin Richter & Hampton LLP

(57) ABSTRACT

System for source side sensing in a memory device. The system includes a source side sensing circuit for use in a memory device to determine core cell data from core cell current. The source side sensing circuit includes a constant current source coupled to receive the core cell current, and a cascode circuit coupled to the constant current source to convert the core cell current to an output voltage that is representative of the core cell data.

6 Claims, 2 Drawing Sheets

SYSTEM FOR SOURCE SIDE SENSING

FIELD OF THE INVENTION

The present invention relates generally to sensing circuits for use in a memory device, and more particularly, to a source side sensing circuit for use in a memory device.

BACKGROUND OF THE INVENTION

For low voltage operation of a memory device, for example a "Flash" memory device, a sensing circuit is used to sense core cell current to determine memory data values. However, typical sensing circuits may have problems providing enough usable gain, and as a result, it may difficult to accurately determine memory data values.

FIG. 1 shows a conventional sensing circuit 100 for use with a memory device. A core cell current (I0) derived from a core cell 102 is sensed by a resistor 104. The current appears as a voltage (SAIn) that is coupled to a comparator 106 and compared to a reference signal. The comparator 106 produces a core cell data value as a result of the comparison. The fixed resistor 104 is used to convert the core cell current I0 to a voltage for comparison.

FIG. 2 shows another conventional sensing circuit 200 for use with a memory device. The core cell current I0 is coupled to a drain of transistor 202. During operation, when the transistor is turned off, the SAIn node starts increasing in voltage. The SAIn voltage will be dependant on the core cell data.

Unfortunately these conventional sensing circuits may have problems providing enough gain or voltage differential on the SAIn terminal for accurate comparison. Therefore is would be desirable to have a sensing circuit that overcomes the problems associated with conventional sensing circuits.

SUMMARY OF THE INVENTION

The present invention includes a system for source side sensing in a memory device. The system includes a constant current source to determine a core cell current and a cascode circuit to convert the core cell current to an output voltage. The output voltage is used to compare to a reference signal to determine the data value of the memory cell.

In one embodiment of the invention, a source side sensing circuit for use in a memory device to determine core cell data from core cell current is provided. The source side sensing circuit includes a constant current source coupled to receive the core cell current, and a cascode circuit coupled to the constant current source to convert the core cell current to an output voltage that is representative of the core cell data.

In another embodiment of the invention, a method for source side sensing a core cell current in a memory device is provided. The method includes steps of coupling the core cell current to constant current source, coupling a cascode current provided by a cascode circuit to the constant current source, and converting the cascode current to an output voltage that is representative of the core cell current.

BRIEF DESCRIPTION OF THE DRAWINGS

The forgoing aspects and the attendant advantages of this invention will become more readily apparent by reference to the following detailed description when taken in conjunction with the accompanying drawings wherein.

DETAILED DESCRIPTION OF THE INVENTION

The present invention includes a system for source side sensing in a memory device. The following are exemplary embodiments of a source side sensing circuit included in the present invention. The exemplary embodiments are intended to be exemplary and not restrictive of the scope of the invention. Therefore, changes or substitutions to the described embodiments are possible without deviating from the scope of the invention.

Figure 1:
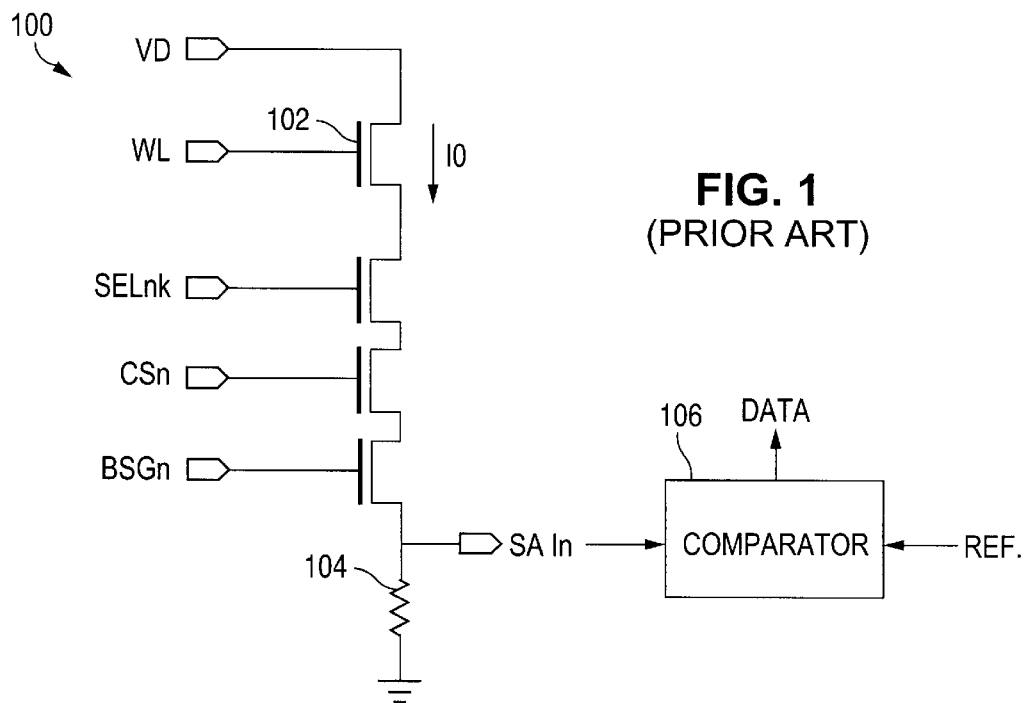
FIG. 1 shows a conventional sensing circuit for use with a memory device.
Figure 2:
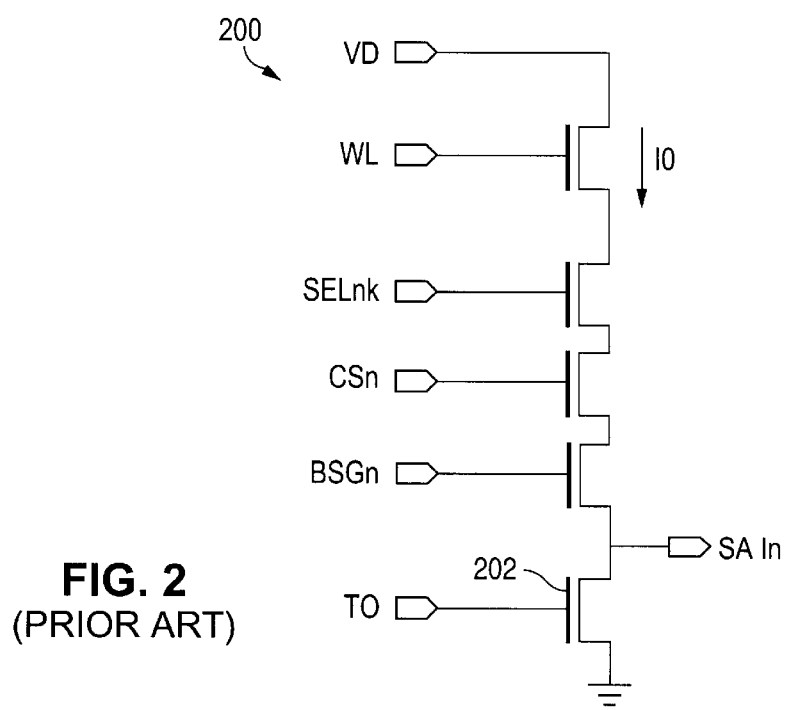
FIG. 2 shows another conventional sensing circuit for use with a memory device.
Figure 3:
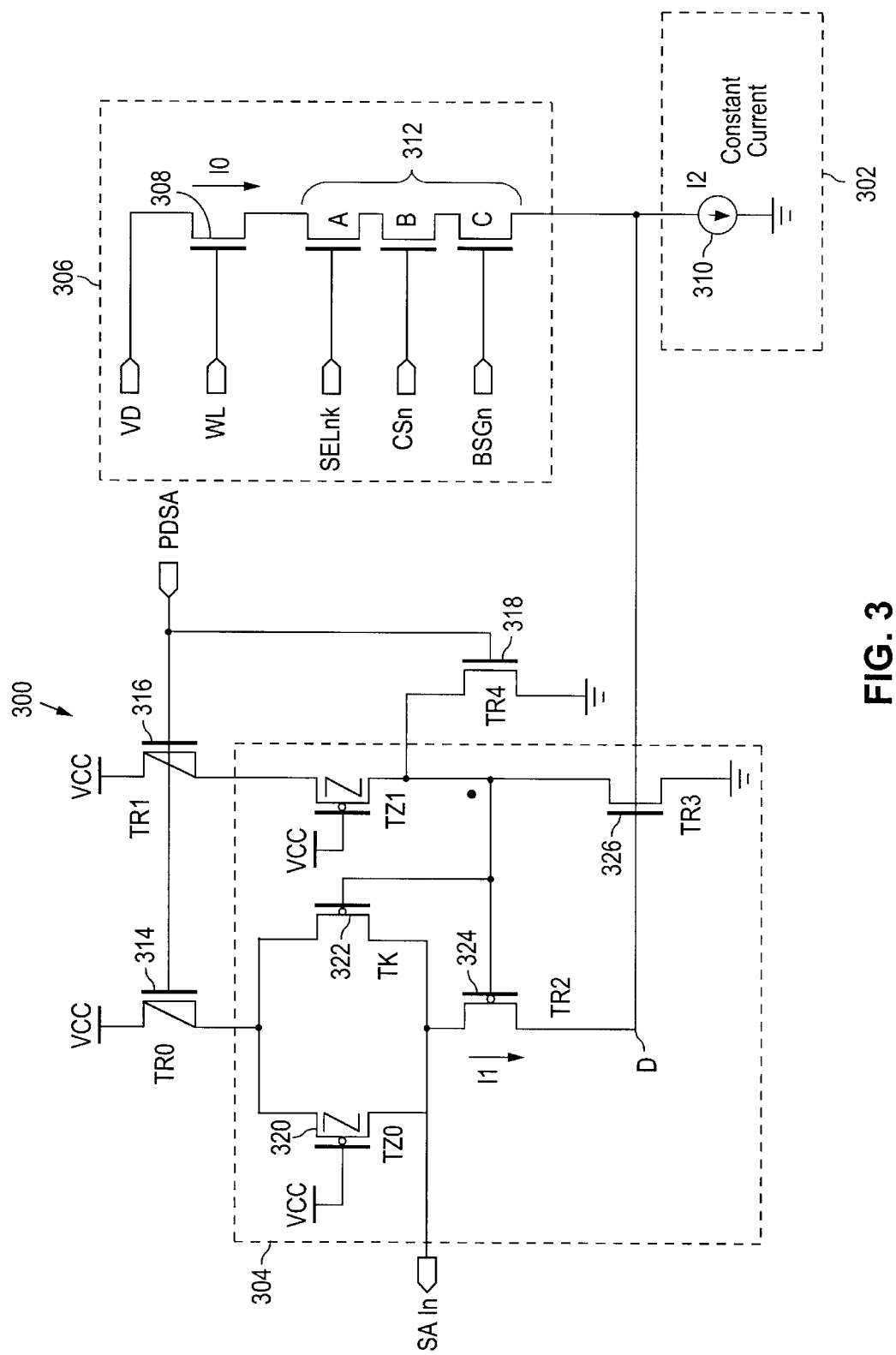
FIG. 3 shows one embodiment of a source side sensing circuit constructed in accordance with the present invention.

FIG. 3 shows one embodiment of a source side sensing circuit 300 constructed in accordance with the present invention. The source side sensing circuit 300 can be used in a memory device to read core cell current to determine memory data values. For example, the source side sensing circuit 300 converts core cell current to a voltage that is compared to a reference signal to determine a memory data value.

The circuit 300 includes a constant current circuit 302 and a cascode circuit 304 that are coupled to a core cell current (I0) from core cell circuit 306. The constant current circuit 302 includes a constant current source 310 that provides a constant current (I2). The core cell circuit 306 includes a core cell 308 and select transistors 312. The select transistors 312 are comprised of a sector select transistor A, a column select transistor B, and a byte select for ground transistor C. Furthermore, power down transistors 314, 316 and 318 are shown, however, these transistors operate during memory power down functions and will not be described in detail here. It will be assumed that these transistors are set to allow normal operation of the source side sensing circuit 300.

A cascode current (I1) is also coupled to the constant current circuit 302. During operation, the constant current circuit 302 sets a current level associated with data stored in the core cell 308. For example, a current level of approximately 0.0 microamps determines a low level or a "0" stored in the core cell, and a current level of approximately 20.0 microamps determines a high level or a "1" stored in the core cell.

When the core cell current I0 is approximately 0.0 microamps, the constant current I2 is derived from the cascode current I1, so that I1 will equal approximately 20.0 microamps. The cascode current I1 is reflected in the voltage at node SAIn. When the core cell current I0 is approximately 20.0 microamps, the cascode current I1 will be approximately 0.0 microamps. This level of cascode current will then be reflected in the voltage at node SAIn. Thus, the cascode current I1 is used to set the voltage level at SAIn, which may then be coupled to a comparator to be compared against a reference signal to accurately determine core cell data.

The cascode stage 304 includes transistors 320, 322, 324, and 326. During operation of the cascode stage, the cascode current (I2) is determined by the constant current circuit 302. For example, if the core cell current I0 is approximately 0.0 microamps, the cascode current I1 will be approximately 20.0 microamps.

In one embodiment, if the voltage at node D is regulated at a constant voltage by the cascode stage 304, then the constant current circuit 302 may be comprised of a single resistor. However, any other type of constant current may be suitable for use as the constant current circuit 302. Furthermore, in other embodiments included in the present invention, other types or arrangements of cascode circuits are suitable for use as the cascode circuit 304. Thus, the invention is not limited to the exemplary cascode circuit 304 shown in FIG. 3.

The present invention includes a system for source side sensing in a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. A source side sensing circuit for use in a memory device to determine core cell data from core cell current, the source side sensing circuit comprising:

a constant current source coupled to a source of the core cell, that receives the core cell current; and a cascode circuit coupled to the source of the core cell, that converts the core cell current to an output voltage that is representative of the core cell data, said cascode circuit including first and second transistors coupled together at common source and drain terminals.

2. The source side sensing circuit of claim 1, wherein the constant current source is a resistor.

3. The source side sensing circuit of claim 1, wherein the cascode circuit further includes a third transistor connected to the common source terminal and also connected to the constant current source.

4. The source side sensing circuit of claim 3, further comprising a fourth transistor connected to the common drain terminal and to a power supply.

5. The source side sensing circuit of claim 4, wherein the constant current source is a resistor.

6. The source side sensing circuit of claim 4, wherein the constant current source provides a current that is substantially equal to 20 microamps.

* * * * *